Feb. 26, 1963 W. EBBINGE 3,079,566
TRANSISTOR AMPLIFIER
Filed Nov. 25, 1958
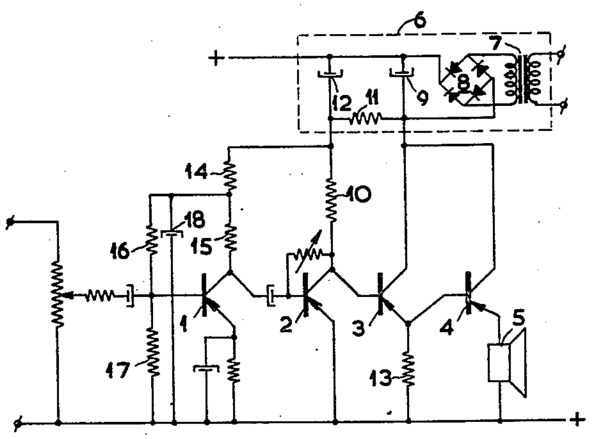
INVENTOR
WILLEM EBBINGE
BY [signature]
AGENT 3,079,566

TRANSISTOR AMPLIFIER

Willem Ebbinge, Eindhoven, Netherlands, assignor to North American Philips Company, Inc., New York, N.Y., a corporation of Delaware Filed Nov. 25, 1958, Ser. No. 776,349
Claims priority, application Germany Dec. 7, 1957
2 Claims. (Cl. 330—20)

The invention relates to a transistor amplifier which is connected to the supply source and comprises a cascade of a plurality of transistor stages. Such amplifiers give rise to the difficulty that the smoothing of the rectified supply voltage has to fulfill extremely severe requirements, since the output impedance is comparatively low and the current taken from the supply source is comparatively high. Therefore, the capacitors required for smoothing are comparatively large and costly.

The invention has for its object to obviate these disadvantages and is characterized in that at least the last transistor of the cascade is driven in common collector connection by including a load impedance, for example a loudspeaker, in the emitter circuit, in that the collector is connected to the rectified, however poorly smoothed supply voltage and the base, is connected, for direct currents, to the collector of the preceding transistor of the cascade, the collector of the preceding transistor is fed via a resistor with a comparatively well smoothed, rectified mains voltage.

Cascade amplifiers comprising a plurality of transistors driven in common collector connection are known per se. The object of this arrangement is, usually, to adapt only the output resistance of a preceding transistor to the comparatively low input impedance of the next following transistor. No particular measures are taken in this case to suppress the hum of the supply source in the output impedance. The invention permits of suppressing drastically the hum, so that the supply member may be much cheaper.

The invention will now be explained with reference to the drawing.

The drawing shows a plurality of transistor amplifying stages 1, 2, 3, 4 in cascade connection. The emitter circuit of the last transistor 4 includes an output impedance, for example a loudspeaker 5. The supply from the alternating-current source takes place via a supply device 6, which comprises a transformer 7 connected to the A.-C. source, a full-wave rectifier 8 and a smoothing capacitor 9.

In accordance with the invention at least the last transistor 4 is driven in common collector connection, the collector being fed by the supply voltage produced across the capacitor 9, which is smoothed only to a small extent. The base of the transistor 4 is connected, for direct current, via the transistor 3 to the collector of the preceding transistor 2; the collector of transistor 2 is connected, via a resistor 10, to a point of comparatively well smoothed supply voltage. This voltage is obtained in the simplest way by further smoothing of the supply voltage produced across the capacitor 9 by means of a resistor 11 and a capacitor 12.

The circuit arrangement operates as follows.

The collectors of the transistors 1 and 2, which collectors take only little supply current, have a substantially negligible hum voltage owing to the improved smoothing with the aid of the filter 11, 12. The hum voltage at the base of the transistor 3 is therefore, also substantially negligible. Since the transistor 3 and also the transistor 4 are driven in common collector connection, the hum voltage of the supply voltage produced across the capacitor 9 cannot penetrate up to the emitter resistors 13 and 5 respectively. Thus, the capacitor 9 may be comparatively small, although the transistors 3 and 4 take a comparatively high supply current.

In a practical embodiment the transistors 1 and 2 were of the OC 71 type, the transistor 3 was of the OC 72 type, the transistor 4 of the OC 30 type. The loudspeaker 5 had a resistance of 20 ohms. The capacitors 9 and 12 had values of $2 \times 500$ $\mu$f. The values of the resistors 10, 11 and 13 to 17 were 6.8K ohms, 470 ohms, 3.3K ohms, 4.7K ohms, 10K ohms, 5.6 and 3.3K ohms, respectively, and the capacitor 18 had a value of 100 $\mu$f. The proportioning is such that a direct-voltage drop occurs across the loudspeaker of a value which is only little below half the rectified, poorly smoothed mains voltage, produced across the capacitor 9. It is thus ensured that the final transistor 4 is adjusted to its maximum output power.

What is claimed is:

1. A cascade transistor amplifier comprising a plurality of transistor stages, the last transistor of the cascade being connected in common collector connection, a load impedance in the emitter circuit of said last transistor, a source of filtered supply voltage having at least two outputs with different degrees of filtering, the collector of the last transistor being connected to a relatively unfiltered output of said source, the base of said last transistor being direct-current conductively connected to the collector of a second transistor of said cascade through the emitter and base of a preceding transistor connected in common collector configuration, means for supplying an input signal to the emitter-base circuit of said second transistor, the collector of the preceding transistor being connected to said relatively unfiltered output of said source, the collector of the second transistor being connected to a relatively filtered output of said source, and a resistor connected between the collector of the preceding transistor and the relatively filtered output, said resistor having a value such that the direct-voltage drop across the load impedance is substantially one-half the relatively unfiltered voltage of said source.

2. A cascade transistor amplifier comprising a plurality of transistor stages, the last transistor of the cascade being connected in common collector connection, a load impedance in the emitter circuit of said last transistor, a source of filtered supply voltage having at least two outputs with different degrees of filtering, the collector of the last transistor being connected to a relatively unfiltered output of said source, the base of said last transistor being direct-current conductively connected to the collector of a second transistor of said cascade, means for supplying an input signal to the emitter-base circuit of said second transistor, the collector of the second transistor being connected to a relatively filtered output of said source, and a resistor connected between the collector of the second transistor and the relatively filtered output, said resistor having a value such that the direct-voltage drop across the load impedance is substantially one-half the relatively unfiltered voltage of said source.

References Cited in the file of this patent

UNITED STATES PATENTS

| | | |
|---|---|---|
| 1,419,797 | Alexanderson | June 13, 1922 |
| 2,663,830 | Oliver | Dec. 22, 1953 |
| 2,747,455 | Spracklen | May 29, 1956 |
| 2,789,164 | Stanley | Apr. 16, 1957 |

OTHER REFERENCES

Lo et al.: "Transistor Electronics," 1955, pages 47 and 178.

Booth: "Transistorized Receiver for Mobile F-M," Electronics, November 1956, pages 158–161.